(12) United States Patent
Ito

(10) Patent No.: US 7,759,259 B2
(45) Date of Patent: Jul. 20, 2010

(54) METHOD OF MANUFACTURING SEMICONDUCTOR DEVICE

(75) Inventor: Takayuki Ito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 19 days.

(21) Appl. No.: 12/109,512

(22) Filed: Apr. 25, 2008

(65) Prior Publication Data

US 2008/0280428 A1 Nov. 13, 2008

(30) Foreign Application Priority Data

May 7, 2007 (JP) .............................. 2007-122455

(51) Int. Cl.
*H01L 21/469* (2006.01)
*H01L 21/425* (2006.01)
*H01L 21/3105* (2006.01)

(52) U.S. Cl. ...................... 438/763; 438/530; 438/978; 257/E21.241

(58) Field of Classification Search .................. 438/530, 438/763, 978
See application file for complete search history.

(56) References Cited

U.S. PATENT DOCUMENTS

2004/0251518 A1* 12/2004 Preusse et al. ............... 257/571
2006/0216875 A1* 9/2006 Ito et al. ...................... 438/149

FOREIGN PATENT DOCUMENTS

| JP | 63-207125 | 8/1988 |
| JP | 2004-356322 | 12/2004 |
| JP | 2005-209698 | 8/2005 |
| JP | 2006-179837 | 7/2006 |
| JP | 2006-278532 | 10/2006 |
| JP | 2007-525844 | 9/2007 |
| WO | WO 03/079423 | 9/2003 |

OTHER PUBLICATIONS

Japanese Notification of Reasons for Rejection in Japanese Patent Application No. 2007-122455 Mailed Jun. 26, 2009.

* cited by examiner

*Primary Examiner*—Savitri Mulpuri
*Assistant Examiner*—Calvin Choi
(74) *Attorney, Agent, or Firm*—Finnegan, Henderson, Farabow, Garrett & Dunner, L.L.P.

(57) ABSTRACT

A method of manufacturing a semiconductor device including heating a semiconductor substrate, has forming a cap film on a surface of said semiconductor substrate; selectively removing said cap film at least from an upper surface of an edge of said semiconductor substrate, a bevel surface of the edge of said semiconductor substrate and a side surface of the edge of said semiconductor substrate; selectively removing at least a device forming film formed on the upper surface of the edge of said semiconductor substrate, the bevel surface of the edge of said semiconductor substrate and the side surface of the edge of said semiconductor substrate; and heating said semiconductor substrate by irradiating said semiconductor substrate with light having a pulse width of 0.1 milliseconds to 100 milliseconds from a light source after removing said device forming film, wherein said cap film has a lower reflectance at a peak wavelength of said light than said semiconductor substrate.

16 Claims, 5 Drawing Sheets

| WAFER NUMBER | POSITION OF OCCURRENCE OF SLIP DISLOCATION (DISTANCE FROM BOUNDARY BETWEEN UPPER SURFACE AND BEVEL SURFACE OF WAFER) |
|---|---|
| 1 | 2.3mm |
| 2 | 1.5mm |
| 3 | 1.8mm |
| 4 | 1.2mm |
| 5 | 2.1mm |
| 6 | 2.4mm |
| 7 | NO SLIP |
| 8 | 2.1mm |
| 9 | 1.6mm |
| 10 | 2.2mm |
| 11 | 2.3mm |
| 12 | 1.7mm |
| 13 | 1.8mm |
| 14 | 2.1mm |
| 15 | 2.3mm |
| 16 | 2.4mm |
| 17 | NO SLIP |
| 18 | 1.9mm |
| 19 | 2.4mm |
| 20 | 2.6mm |

METHOD OF MANUFACTURING SEMICONDUCTOR DEVICE

CROSS-REFERENCE TO RELATED APPLICATION

This application is based upon and claims the benefit of priority from the prior Japanese Patent Application No. 2007-122455, filed on May 7, 2007, the entire contents of which are incorporated herein by reference.

BACKGROUND OF THE INVENTION

1. Field of the Invention

The present invention relates to a method of manufacturing a semiconductor device that involves heating a semiconductor substrate with a high density light source.

2. Background Art

The performance of large scale integrated (LSI) circuits is being improved by increasing the integration density, or in other words, by making elements constituting LSI circuits smaller. As the element size becomes smaller, the parasitic resistance and the short channel effect increase. Thus, the importance of forming a shallow p-n junction having a low resistance is increasing.

A shallow impurity diffusion region can be formed by optimizing ion implantation with a low acceleration energy and subsequent annealing.

In order to decrease the diffusion layer resistance of the impurity diffusion region, annealing for activating the impurity has to be carried out at high temperature. The impurity to be ion-implanted is boron (B), phosphorus (P) or arsenic (As).

However, such an impurity has a high diffusion coefficient in silicon (Si). Therefore, in rapid thermal annealing (RTA) using a halogen lamp, inward and outward diffusions of the impurity ion occurs, and it is difficult to form a shallow impurity diffusion layer.

The inward and outward diffusions can be reduced by decreasing the annealing temperature. However, if the annealing temperature is decreased, the activation rate of the impurity significantly decreases. Therefore, it is difficult to form an impurity diffusion layer having low resistance and shallow junction (20 nm or less) by the conventional RTA using a halogen lamp.

In order to solve the problem, in recent years, as a method of instantaneously supplying energy required for activation, there has been contemplated an annealing method that uses a laser or a flash lamp containing an inert gas, such as xenon (Xe), as a light source. These light sources can complete light emission in a period (pulse width) of 100 milliseconds or shorter or, at the minimum, sub-milliseconds. Therefore, these light sources can activate the impurity ions without substantially changing the distribution of the impurity ions implanted into the upper surface of the wafer.

However, conventional laser annealing and flash lamp annealing (FLA) have the following problem. That is, to sufficiently activate the impurity, the temperature of the upper surface of the wafer easily rises to 1200 degrees C. or higher at a rate of temperature rise of $1 \times 10^5$ degrees C./second or higher. As a result, a temperature difference occurs between the upper surface and the lower surface of the wafer, and the thermal stress in the wafer increases. The increased thermal stress causes damages to the wafer, such as slip dislocation, fracture and deformation, and leads to a reduction in production yield.

In addition, in recent years, cap films, such as a light absorbing film and a reflection reducing film, have been developed in order to prevent the effective annealing temperature from varying due to a difference in pattern size or coverage ratio when a semiconductor substrate with a pattern formed thereon is annealed.

A conventional method of manufacturing a semiconductor device involves forming, on a semiconductor substrate, a translucent film (a cap film) having a lower refractive index than the semiconductor substrate, heating the semiconductor substrate to a temperature equal to or higher than 300 degrees C. and equal to or lower than 600 degrees C., and irradiating the upper surface of the semiconductor substrate with light having a pulse width of 0.1 milliseconds to 100 milliseconds through the translucent film, and the thickness of the translucent film is determined by the peak wavelength of the light and the refractive index of the translucent film (see Japanese Patent Laid-Open No. 2006-278532, for example).

According to the conventional method of manufacturing a semiconductor device described above, occurrence of crystal defects in the semiconductor substrate can be reduced, and a shallow p-n junction having low resistance can be formed.

However, the conventional technique described above does not take damages at the outer perimeter of the wafer (in particular, damages in the vicinity of the bevel part) into account and is not designed to reduce crystal defects, cracks or the like occurring as a result of the FLA process using a flash lamp or the like.

SUMMARY OF THE INVENTION

According to one aspect of the present invention, there is provided: a method of manufacturing a semiconductor device including heating a semiconductor substrate, comprising:

forming a cap film on a surface of said semiconductor substrate;

selectively removing said cap film at least from an upper surface of an edge of said semiconductor substrate, a bevel surface of the edge of said semiconductor substrate and a side surface of the edge of said semiconductor substrate;

selectively removing at least a device forming film formed on the upper surface of the edge of said semiconductor substrate, the bevel surface of the edge of said semiconductor substrate and the side surface of the edge of said semiconductor substrate; and heating said semiconductor substrate by irradiating said semiconductor substrate with light having a pulse width of 0.1 milliseconds to 100 milliseconds from a light source after removing said device forming film, wherein said cap film has a lower reflectance at a peak wavelength of said light than said semiconductor substrate.

According to the other aspect of the present invention, there is provided: a method of manufacturing a semiconductor device, comprising:

forming a gate insulating film on a semiconductor substrate;

forming a gate electrode on said gate insulating film;

implanting an impurity ion into said semiconductor substrate using said gate electrode as a mask;

forming a cap film on a surface of said gate electrode and a surface of said semiconductor substrate.

selectively removing said cap film at least from an upper surface of an edge of said semiconductor substrate, a bevel surface of the edge of said semiconductor substrate and a side surface of the edge of said semiconductor substrate;

selectively removing at least a device forming film formed on the upper surface of the edge of said semiconductor substrate, the bevel surface of the edge of said semiconductor substrate and the side surface of the edge of said semiconductor substrate; and heating said semiconductor substrate by irradiating said semiconductor substrate with light having a pulse width of 0.1 milliseconds to 100 milliseconds from a light source after removing said device forming film, wherein said cap film has a lower reflectance at a peak wavelength of said light than said semiconductor substrate.

DETAILED DESCRIPTION

In the following, an embodiment of the present invention will be described with reference to the drawings.

In the embodiment, a heat treatment for activating an ion-implanted impurity will be described. Impurities to be implanted include n-type impurities, such as P and As, and p-type impurities, such as B. However, the heat treatment according to the embodiment of the present invention is not limited to such a heat treatment for activating an impurity. For example, the present invention can also be applied to heat treatments for forming an insulating film, such as an oxide film and a nitride film, or for recrystallizing a damaged layer or the like.

Embodiment 1

Figure 1:
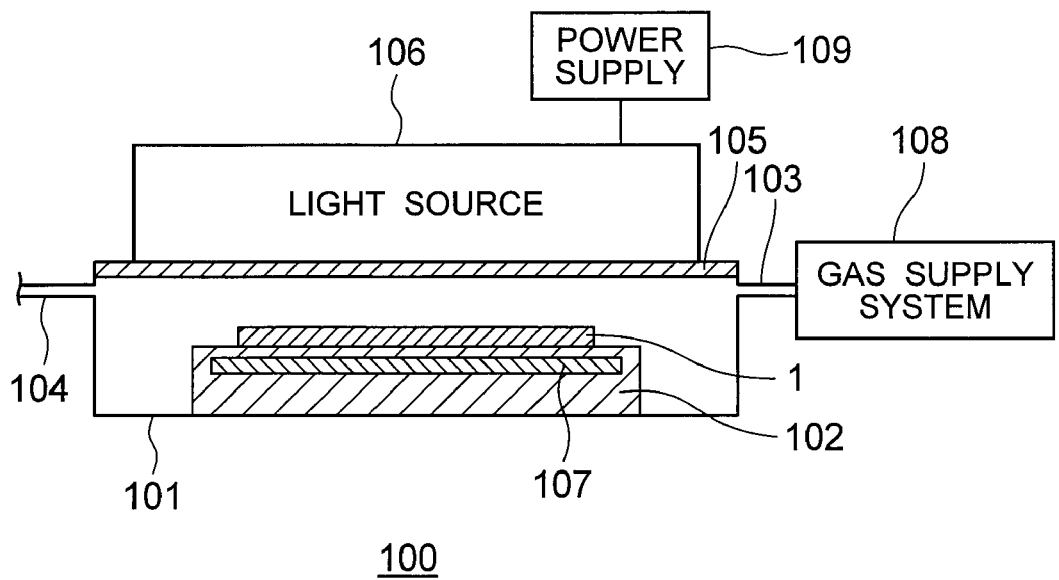
FIG. 1 is a diagram showing an example of a heat treatment apparatus used in a method of manufacturing a semiconductor device according to an embodiment 1 of the present invention.
Figure 2:
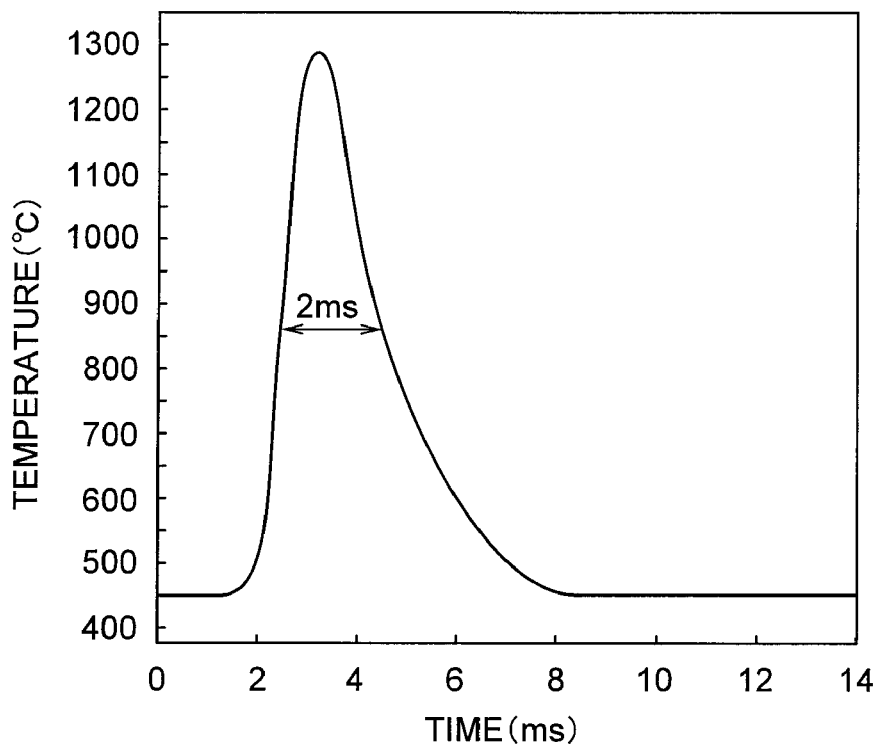
FIG. 2 is a graph showing exemplary heating characteristics of a light source of the heat treatment apparatus used in the method of manufacturing a semiconductor device according to the embodiment 1.

FIG. 1 is a diagram showing an example of a heat treatment apparatus used in a method of manufacturing a semiconductor device according to an embodiment 1 of the present invention, which is an aspect of the present invention. FIG. 2 is a graph showing exemplary heating characteristics of a light source of the heat treatment apparatus used in the method of manufacturing a semiconductor device according to the embodiment 1, which is an aspect of the present invention.

As shown in FIG. 1, a heat treatment apparatus 100 has a processing chamber 101 in which a heat treatment for activating an impurity implanted into a semiconductor substrate (wafer) 1 made of silicon or the like is carried out, a susceptor 102 which is disposed in the processing chamber 101 and on which the semiconductor substrate 1 is mounted, an inlet pipe 103 for supplying an atmospheric gas into the processing chamber 101, an exhaust pipe 104 for discharging the atmospheric gas from the processing chamber 101, a transparent window 105 disposed at the top of the processing chamber 101 to be opposed to the susceptor 102, and a light source 106 that irradiates the upper surface of the semiconductor substrate 1 with a light pulse through the transparent window 105.

The processing chamber 101 is made of metal, such as stainless steel.

The susceptor 102 on which the semiconductor substrate 1 is mounted is disposed on the bottom of the processing chamber 101. The susceptor 102 is made of aluminum nitride (AlN), ceramic, quartz or the like and incorporates a heating source 107 for heating the semiconductor substrate 1. Alternatively, the susceptor 102 made of AlN, ceramic, stainless steel or the like can be covered with quartz for protection.

The heating source 107 can be a hot plate, an embedded metal heater of a nichrome wire or the like, a heating lamp, such as a halogen lamp, for example. The temperature is controlled by a control system (not shown), which is installed outside the processing chamber 101.

A gas supplying system 108, which has a gas source of an inert gas or the like to be supplied to the processing chamber 101 when heat treatment of the semiconductor substrate 1 is carried out, is connected to the inlet pipe 103.

The light source 106, which is a flash lamp or the like, irradiates the upper surface of the semiconductor substrate 1 with a light pulse through the transparent window 105, which is made of synthetic quartz or the like, to heat the semiconductor substrate 1.

A power supply 109, which is a pulsed power supply or the like, drives the light source 106 to emit a light pulse having an extremely short pulse width (FWHM) of about 0.1 to 100 milliseconds. The power supply 109 controls the pulse width and the irradiation energy of the light emitted from the light source 106. The irradiation energy density of the light source 106 ranges from about 5 J/cm$^2$ to about 100 J/cm$^2$, for example.

The transparent window 105 serves not only to allow the light emitted from the light source 106 and applied to the semiconductor substrate 1 to pass through but also to separate the processing chamber 101 from the light source 106 and hermetically seals the processing chamber 101.

In a heat treatment for activating an ion-implanted impurity, if the FWHM of the light emitted from the light source 106 is equal to or less than 0.1 milliseconds, the irradiation energy density of the emitted light required to heat to an activation heat treatment temperature increases, and the thermal stress occurring in the semiconductor substrate 1 increases. On the other hand, if the FWHM of the emitted light is more than 100 milliseconds, the implanted impurity is diffused.

In the activation heat treatment, the semiconductor substrate 1 mounted on the susceptor 102 is supplementarily heated by the heating source 107 in a range of 300 to 600 degrees C., more desirably in a range of 400 to 500 degrees C., for example. The supplementary heating is carried out at a temperature that does not induce damage to the semiconductor substrate 1.

In the activation heat treatment, the light source 106 emits light once, and one pulse of emitted light is applied to the semiconductor substrate 1. In the case where the FWHM of the one pulse of emitted light is about 2 milliseconds, the irradiation energy density falls within a range of about 28 j/cm$^2$ to about 36 J/cm$^2$ if the supplementary heating temperature is 300 degrees C. or falls within a range of about 18 j/cm$^2$ to about 26 j/cm$^2$ if the supplementary heating temperature is 600 degrees C., for example. If the supplementary heating temperature is about 450 degrees C., the irradiation energy density falls within a range of about 20 J/cm$^2$ to about 30 J/cm$^2$. In this embodiment, for example, the activation heat treatment is carried out under the conditions that the supplementary heating temperature is about 450 degrees C., and the irradiation energy density is about 25 J/cm$^2$.

If a Xe flash lamp is used as the light source 106, for example, the temperature profile of the heating is as shown in FIG. 2. That is, the maximum temperature is about 1300 degrees C., the FWHM is about 2 milliseconds. The Xe flash lamp can achieve more abrupt temperature increase or decrease than infrared lamps used for RTA, such as a halogen lamp.

For example, the halogen lamp takes 10 or more seconds, for example, about 15 seconds, to increase or decrease the temperature between 450 degrees C. and 1300 degrees C. In addition, the halogen lamp takes 2 to 3 seconds to increase or decrease the temperature by 400 degrees C. between 900 degrees C. and 1300 degrees C.

On the other hand, the flash lamp takes only about 0.1 milliseconds to about 100 milliseconds, for example, about 6 milliseconds, to increase or decrease the temperature between 450 degrees C. and 1300 degrees C. In addition, the flash lamp takes only about 2 milliseconds to increase or decrease the temperature between 900 degrees C. and 1300 degrees C. The surface temperature of the semiconductor substrate 1 is measured with a high speed pyrometer.

In this embodiment, the heat treatment for activating the impurity implanted into the semiconductor substrate 1 can be carried out, for example, at a high temperature of 900 degrees C. or higher in an extremely short time. Therefore, the length of diffusion of the impurity due to the activation heat treatment can be reduced to 5 nm or less, and a shallow p-n junction can be formed.

For example, the spectrum of the light of the Xe flash lamp is close to that of white light, and a main intensity peak appears at a wavelength within a range of 400 nm to 500 nm. Light having a wavelength in a range including the intensity peak of the flash lamp light, for example, light having a wavelength equal to or less than 1 μm is absorbed in a region from the surface of the semiconductor substrate 1 to a depth of about 0.1 μm. In a region from the surface of the semiconductor substrate 1 to a depth of several tens μm, the temperature locally abruptly increases.

Now, a method of manufacturing a semiconductor device according to this embodiment will be described by taking a process of manufacturing a CMOS transistor as an example.

However, the semiconductor device is not limited to the CMOS transistor. For example, the semiconductor device can also be a p-MOS transistor or an n-MOS transistor. In addition, the semiconductor device can also be an MIS transistor that has an insulating film, such as a SiON film and a Si$_3$N$_4$ film, instead of a SiO$_2$ film or a composite insulating film composed of a SiO$_2$ film and a metal oxide film or the like, such as a SiON film and Si$_3$N$_4$ film.

FIGS. 3A to 3G and 3K are cross-sectional views showing an n-MOS region and a p-MOS region of a semiconductor substrate in different steps of the method of manufacturing a semiconductor device according to the embodiment 1 of the present invention. FIGS. 3H to 3J are cross-sectional views of a bevel and a part around the bevel of the semiconductor substrate in different steps of the method of manufacturing a semiconductor device according to the embodiment 1 of the present invention.

Figure 3A:
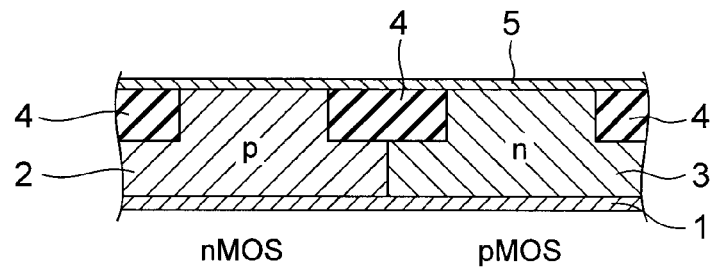
FIG. 3A is a cross-sectional view showing an n-MOS region and a p-MOS region of a semiconductor substrate in a step of the method of manufacturing a semiconductor device according to the embodiment 1 of the present invention.

As shown in FIG. 3A, a p well layer 2 is formed in an n-MOS region of a semiconductor substrate 1, which is made of p-type Si or the like, and an n well layer 3 is formed in a p-MOS region of the semiconductor substrate 1. A device isolation region 4 is formed around the p well layer 2 and the n well layer 3. The n-MOS region and the p-MOS region are separated as device regions by the device isolation region 4. Then, on the upper surface of the semiconductor substrate 1, an insulating film 5, such as a thermal oxide film (a SiO$_2$ film or a SiON film (the N concentration in the surface layer is less than 15%), for example), is formed.

Figure 3B:
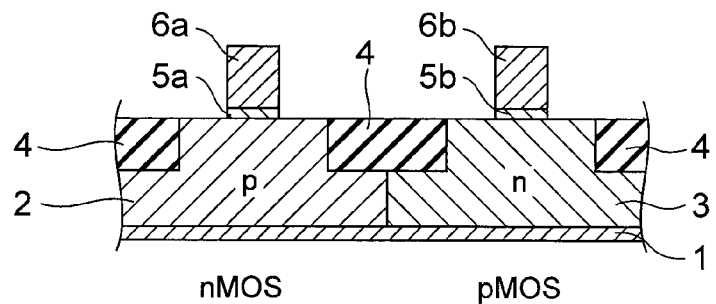
FIG. 3B is a cross-sectional view showing an n-MOS region and a p-MOS region of a semiconductor substrate in a step of the method of manufacturing a semiconductor device according to the embodiment 1 of the present invention, is continuous from FIG. 3A.
Figure 3C:
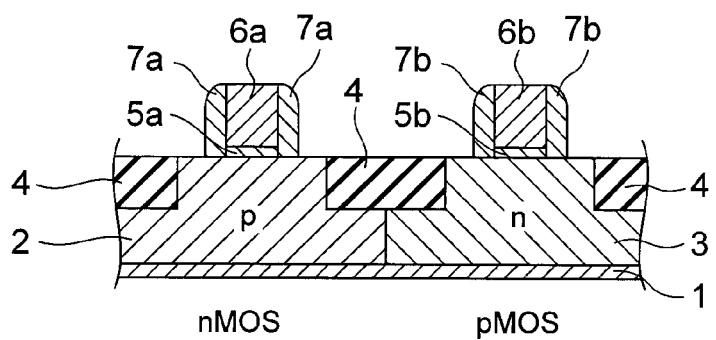
FIG. 3C is a cross-sectional view showing an n-MOS region and a p-MOS region of a semiconductor substrate in a step of the method of manufacturing a semiconductor device according to the embodiment 1 of the present invention, is continuous from FIG. 3B.

Then, on the insulating film 5, a poly-Si film (or a poly-SiGe film (the Ge concentration is 10 to 30%)) having a thickness of 50 nm to 150 nm is deposited by LPCVD, for example. P or As is ion-implanted to the n-MOS transistor and B is ion-implanted to the p-MOS transistor in an amount of 3×10$^{15}$ cm$^{-2}$ to 8×10$^{15}$ cm$^{-2}$, and then, the poly-Si film and the insulating film 5 are selectively removed by photolithography, reactive ion etching (RIE) or the like. In this way, gate electrodes 6a and 6b and gate insulating films 5a and 5b are formed in the n-MOS region and the p-MOS region, respectively (FIG. 3B). In other words, the gate insulating films 5a and 5b are formed on the semiconductor substrate 1, and the gate electrodes 6a and 6b are formed on the gate insulating films 5a and 5b, respectively.

Then, an insulating film formed by a SiO$_2$ layer or a Si$_3$N$_4$ layer is deposited on the semiconductor substrate 1 by LPCVD or the like. The deposited insulating film is etched back by directional etching, such as RIE, thereby selectively forming sidewall spacers 7a and 7b formed by the insulating film on the side surfaces of the gate electrodes 6a and 6b and the gate insulating films 5a and 5b, respectively. The sidewall spacers 7a and 7b serve to prevent silicidation in a subsequent step.

Then, the p-MOS region is covered with a resist film by photolithography or the like. Using the gate electrode 6a and the sidewall spacer 7a as a mask, a group-V element serving as an n-type source/drain impurity, such as P ion (a second impurity ion), is selectively implanted. The ion implantation is carried out under the conditions that the acceleration energy is 10 keV and the dose is $3\times10^{15}$ cm$^{-2}$, for example. Then, the resist film is removed from the p-MOS region.

Then, the n-MOS region is covered with a resist film by photolithography. Using the gate electrode 6b and the sidewall spacer 7b as a mask, a group-III element serving as a p-type source/drain impurity, such as B ion (a second impurity ion), is selectively implanted. The ion implantation is carried out under the conditions that the acceleration energy is 4 keV and the dose is $3\times10^{15}$ cm$^{-2}$, for example. Then, the resist film is removed from the n-MOS region.

Figure 3D:
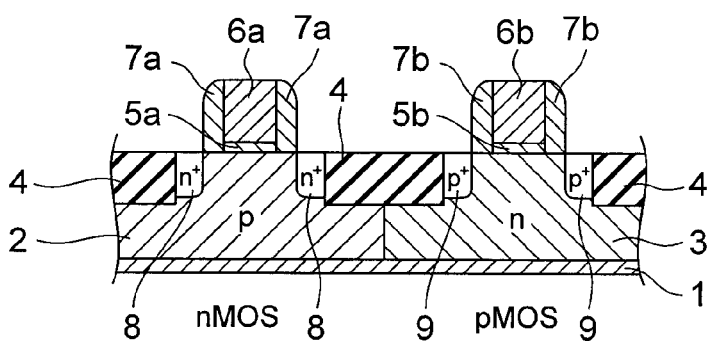
FIG. 3D is a cross-sectional view showing an n-MOS region and a p-MOS region of a semiconductor substrate in a step of the method of manufacturing a semiconductor device according to the embodiment 1 of the present invention, is continuous from FIG. 3C.

Then, the source/drain impurity implanted into the semiconductor substrate 1 and the gate electrodes 6a and 6b is activated at a temperature of about 1000 degrees C. by spike rapid thermal annealing (RTA) or the like. The "spike RTA" is an RTA in which the retention time of the maximum temperature is set at 0. As a result of the activation, source/drain regions 8 and 9 having a depth of about 100 nm, for example, are formed between ends of the sidewall spacers 7a and 7b and the device isolation region 4 (FIG. 3D).

Figure 3E:
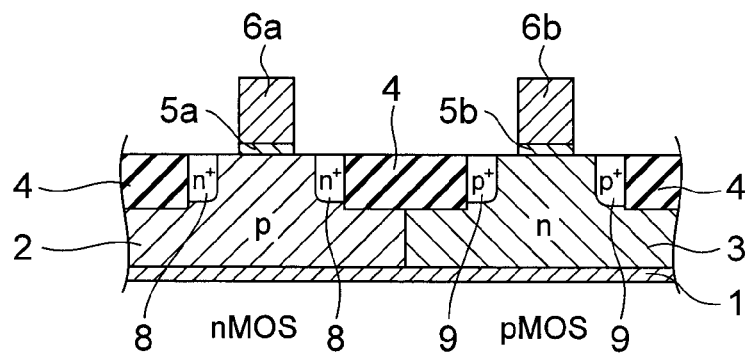
FIG. 3E is a cross-sectional view showing an n-MOS region and a p-MOS region of a semiconductor substrate in a step of the method of manufacturing a semiconductor device according to the embodiment 1 of the present invention, is continuous from FIG. 3D.

Then, as shown in FIG. 3E, the sidewall spacers 7a and 7b are removed by wet etching using thermal phosphoric acid, for example.

Then, the p-MOS region is covered with a resist film by photolithography or the like. Using the gate electrode 6a as a mask, a group-V element serving as an n-type impurity, such as P ion (a first impurity ion), is selectively implanted. The ion implantation is carried out under the conditions that the acceleration energy is 1.5 keV and the dose is $1\times10^{15}$ cm$^{-2}$, for example. Then, the resist film is removed from the p-MOS region. The n-MOS region is covered with a resist film by photolithography. Using the gate electrode 6b as a mask, a group-III element serving as a p-type source/drain impurity, such as B ion (a first impurity ion), is selectively implanted. The ion implantation is carried out under the conditions that the acceleration energy is 0.5 keV and the dose is $1\times10^{15}$ cm$^{-2}$, for example. Then, the resist film is removed from the n-MOS region.

Figure 3F:
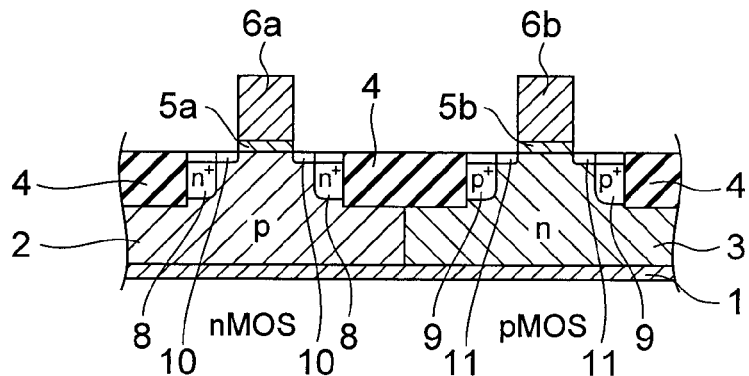
FIG. 3F is a cross-sectional view showing an n-MOS region and a p-MOS region of a semiconductor substrate in a step of the method of manufacturing a semiconductor device according to the embodiment 1 of the present invention, is continuous from FIG. 3E.

In this way, impurity-implanted layers 10 and 11 having a depth of about 15 nm from the upper surface of the semiconductor substrate 1 are formed between the opposite side edges of the gate electrodes 6a and 6b and the device isolation region 4 (FIG. 3F).

Figure 3G:
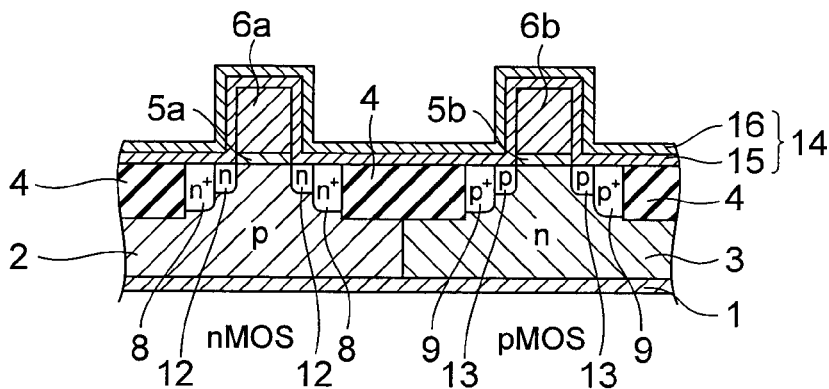
FIG. 3G is a cross-sectional view showing an n-MOS region and a p-MOS region of a semiconductor substrate in a step of the method of manufacturing a semiconductor device according to the embodiment 1 of the present invention, is continuous from FIG. 3F.
Figure 3K:
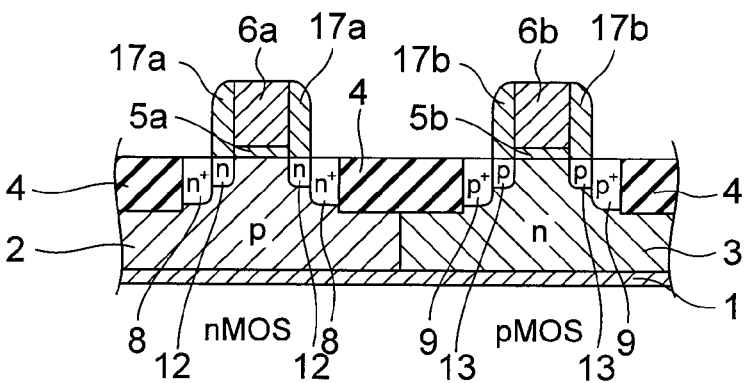
FIG. 3K is a cross-sectional view showing an n-MOS region and a p-MOS region of a semiconductor substrate in a step of the method of manufacturing a semiconductor device according to the embodiment 1 of the present invention, is continuous from FIG. 3J.
Figure 3H:
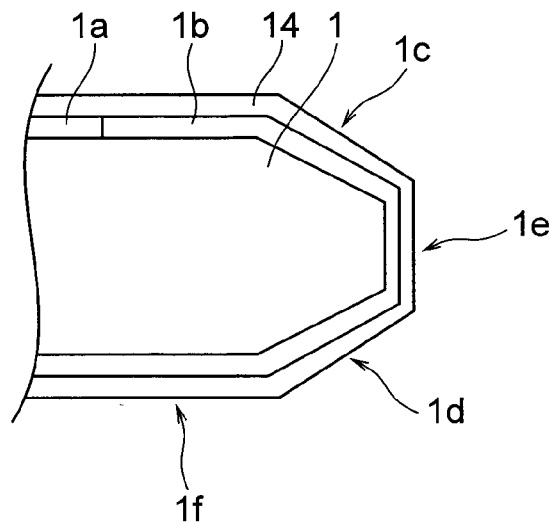
FIG. 3H is a cross-sectional view of a bevel and a part around the bevel of the semiconductor substrate in a step of the method of manufacturing a semiconductor device in FIG. 3G according to the embodiment 1 of the present invention.
Figure 3I:
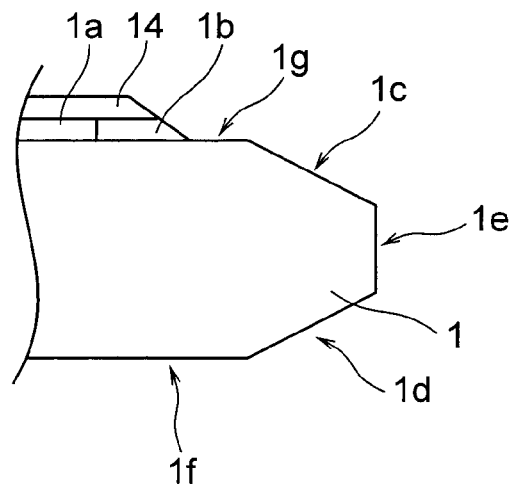
FIG. 3I is a cross-sectional view of a bevel and a part around the bevel of the semiconductor substrate in a step of the method of manufacturing a semiconductor device according to the embodiment 1 of the present invention, is continuous from FIG. 3H.
Figure 3J:
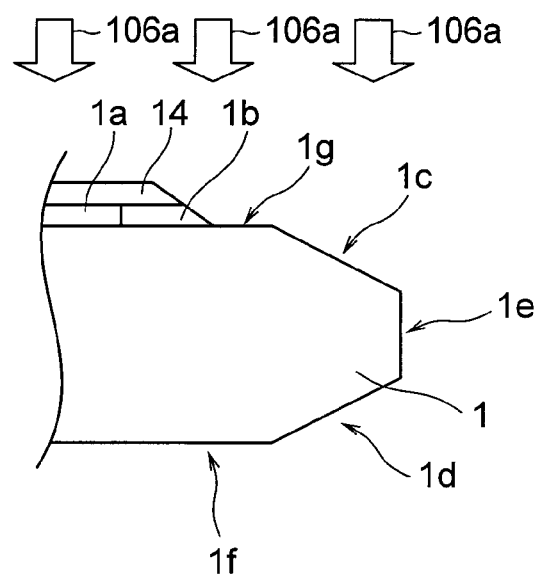
FIG. 3J is a cross-sectional view of a bevel and a part around the bevel of the semiconductor substrate in a step of the method of manufacturing a semiconductor device according to the embodiment 1 of the present invention, is continuous from FIG. 3I.

Then, as shown in FIG. 3G, a cap film 14 having a first insulating film 15 and a second insulating film 16 is formed on the upper surface of the device isolation region 4, the impurity-implanted layers 10 and 11, the gate electrodes 6a and 6b and the like by LPCVD or the like. In this step, the cap film 14 is formed also on bevel surfaces 1c and 1d and a side surface 1e of the edge of the semiconductor substrate 1 and a lower surface 1f of the semiconductor substrate 1 (FIG. 3H). That is, the cap film 14 is formed on the surface of the gate electrodes 6a and 6b and the surface of the semiconductor substrate 1.

The first insulating film 15 and the second insulating film 16 are a Si$_3$N$_4$ film having a thickness of 60 nm and a SiO$_2$ film having a thickness of 80 nm, respectively, and are deposited at a film deposition temperature equal to or lower than 600 degrees C., for example. The cap film 14 is designed to have a lower reflectance at the peak wavelength of the light emitted from the light source 106 than the semiconductor substrate 1 (or a higher absorptance at the peak wavelength of the light emitted from the light source 106 than the semiconductor substrate 1).

In FIG. 3H, a device region 1a of the semiconductor substrate 1 is a region in which the device is to be formed including the p-MOS region and the n-MOS region. A device forming film 1b includes a film formed or deposited on an edge of the semiconductor substrate 1 or the lower surface of the semiconductor substrate 1 in the course of manufacture of the semiconductor device.

Then, the cap film 14 at least on an upper surface 1g of the edge of the semiconductor substrate 1, on the bevel surfaces 1c and 1d of the edge of the semiconductor substrate 1 and on the side surface 1e of the edge of the semiconductor substrate 1 is selectively removed. In particular, in preparation for a subsequent FLA process, the cap film 14 is selectively removed in such a manner that at least the device region 1a of the semiconductor substrate 1 in which the device is to be formed is covered with the cap film 14.

Furthermore, the device forming film 1b at least on the upper surface 1g of the edge of the semiconductor substrate 1, on the bevel surfaces 1c and 1d of the edge of the semiconductor substrate 1 and on the side surface 1e of the edge of the semiconductor substrate 1 is selectively removed (FIG. 3I).

In this embodiment, the cap film 14 and the device forming film 1b on the lower surface 1f of the semiconductor substrate 1 are also removed.

Then, after the cap film 14 and the device forming film 1b are removed, the semiconductor substrate 1 on which the cap film 14 covering the device region 1a of the semiconductor substrate 1 in which the device is to be formed is formed is mounted on the susceptor 102 of the heat treatment apparatus shown in FIG. 1. In the activation heat treatment, the semiconductor substrate 1 is supplementarily heated at the lower surface to about 450 degrees C., for example, by the heating source 107 in the susceptor 102. While maintaining the semiconductor substrate 1 at the supplementary heating temperature of about 450 degrees C., the upper surface of the semiconductor substrate 1 is irradiated with light 106a from the light source 106 that has a pulse width of 0.1 milliseconds to 100 milliseconds (for example, under the conditions that the pulse width is 2 milliseconds and the irradiation energy density is about 25 J/cm$^2$) (FIG. 3J).

By the activation heat treatment, P and B implanted into the impurity-implanted layers 10 and 11 are diffused, trapped in a lattice site as a replacement and activated. As a result, an n-type extension region (a diffusion layer) 12 and a p-type extension region (a diffusion layer) 13 are formed between the opposite side edges of the gate insulating films 5a and 5b and the source/drain regions 8 and 9 (FIG. 3G).

Then, the first insulating film 15 and the second insulating film 16 are etched back by directional etching, such as RIE. The first insulating film 15 and the second insulating film 16 selectively remain on the side surfaces of the gate electrodes 6a and 6b and the gate insulating films 5a and 5b, and thus, sidewall spacers 17a and 17b having a multilayer structure of the Si$_3$N$_4$ film and the SiO$_2$ film are formed (FIG. 3K). Alternatively, the second insulating film 16 of SiO$_2$ can be removed by wet etching using hydrofluoric acid (HF), thereby forming the sidewall spacers 17a and 17b made of Si$_3$N$_4$ of the first insulating film 15.

Then, a metal, such as nickel (Ni), is deposited on the upper surface of the semiconductor substrate 1 by sputtering or the like. Silicidation of the surface of the gate electrodes 6a and 6b and the source/drain regions 8 and 9 exposed between the device isolation region 4 and the sidewall spacers 17a and 17b is carried out by RTA or the like. Then, unreacted Ni is removed by wet etching or the like. An interlayer insulating film, such as a SiO$_2$ film, is deposited on the upper surface of the semiconductor substrate 1. Then, contact holes are formed in the interlayer insulating film on the gate electrodes 6a and 6b, the n$^+$-type source/drain region 8 and the p$^+$-type source/drain region 9. Wiring is connected to the gate electrodes 6a and 6b, the n$^+$-type source/drain region 8 and the p$^+$-type source/drain region 9 via the respective contact holes.

By the process described above, the semiconductor device having the shallow extension regions 12 and 13 having a depth equal to or less than about 20 nm is manufactured.

The first insulating film 15 and the second insulating film 16 of the cap film 14 have a refractive index higher than that of the atmosphere and lower than that of the semiconductor substrate 1, for example. In addition, the second insulating film 16 closer to the atmosphere has a lower refractive index than the first insulating film 15, for example. In this way, the difference in refractive index between adjacent two of the atmosphere, the first insulating film 15, the second insulating film 16 and the semiconductor substrate 1 can be reduced. As a result, the reflectance at the interface of the semiconductor substrate 1 can be reduced.

Now, comparison will be made between a semiconductor substrate processed according to the embodiment 1 of the present invention, which is an aspect of the present invention, and semiconductor substrates processed according to two comparison examples of the prior art, and the result of the comparison will be discussed. The semiconductor device manufacturing processes according to the embodiment 1 and the two comparison examples are the same except that the procedure from the step of source/drain extension ion implantation to the step of fast temperature rising/falling annealing is different as described below.

Embodiment 1 source/drain extension ion implantation→RTA→formation of cap film→etching of cap film and device forming film around bevel→fast temperature rising/falling annealing (flash lamp annealing or laser annealing)

COMPARISON EXAMPLE 1 source/drain extension ion implantation→RTA→fast temperature rising/falling annealing (flash lamp annealing or laser annealing)

COMPARISON EXAMPLE 2 source/drain extension ion implantation→RTA→formation of cap film→fast temperature rising/falling annealing (flash lamp annealing or laser annealing)

Semiconductor devices were manufactured by the manufacturing methods according to the embodiment 1 and the comparison examples 1 and 2 described above.

First, a slip dislocation or crack (a flaw) occurred at the edge (outer perimeter) of silicon substrates (semiconductor substrates) in the comparison examples 1 and 2 in the fast temperature rising/falling annealing step, for example, the flash lamp annealing step, and thus, it was found that the silicon substrates in the comparison examples 1 and 2 are more likely to be damaged.

On the other hand, according to the embodiment 1, a slip dislocation or a crack (a flaw) did not occur at the edge of the silicon substrate, and a micro MOSFET having high drive power was provided.

After the flash lamp annealing, the silicon substrates were analyzed, and the findings described below were obtained.

Silicon substrates according to the comparison examples 1 and 2 that were not damaged were analyzed by X-ray topograph.

Figures 4, 5:
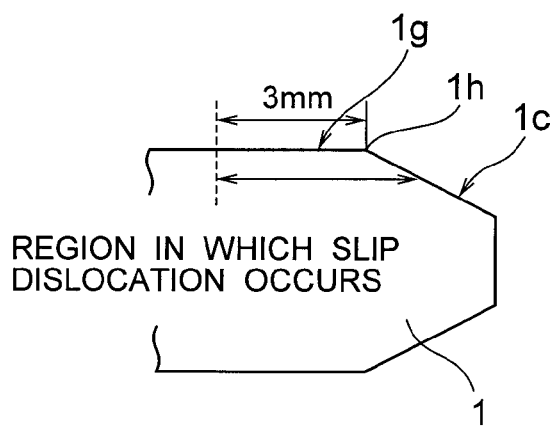
FIG. 4 is a table showing the result of observation by X-ray topograph of semiconductor substrates processed by fast temperature rising/falling annealing.
FIG. 5 is a schematic diagram showing a region in which a slip dislocation occurs in the vicinity of the bevel of the edge of the semiconductor substrate.

FIG. 4 is a table showing the result of observation by X-ray topograph of semiconductor substrates processed by fast temperature rising/falling annealing. FIG. 5 is a schematic diagram showing a region in which a slip dislocation occurs in the vicinity of the bevel of the edge of the semiconductor substrate.

As can be seen from FIG. 4, it is considered that a slip dislocation that occurs in the vicinity of the bevel tends to concentratedly occur in a region extending 1 mm to 3 mm inwardly from a boundary 1h between the upper surface of the semiconductor substrate and the bevel surface (FIG. 5).

In this way, along the outer perimeter of the wafers, white points were observed in the region extending about 1 mm to 3 mm inwardly from the boundary 1h, and it was found that X-ray scattering occurs in that region. From observation of the region in which those bright points appeared by cross-sectional TEM, it was found that a large number of dislocation stacking faults occurred in the <111> direction, and the dislocation stacking faults reached to a depth of 30 μm from the upper surface. In addition, from observation of the stacking faults by planar TEM, it was found that there were intersecting dislocations in the <110> direction. It was also found that, if a cap film that improves the emissivity, such as a light absorbing film (a carbon film, for example) and a light reflection reducing film (an oxide film or a nitride film, for example), is provided, the dislocation density observed increases.

In the following, the different results of the embodiment 1 and the comparison examples 1 and 2 will be logically discussed.

In the comparison examples 1 and 2, there is a film that increases the emissivity during annealing at the outer perimeter of the wafer (in particular, in the vicinity of the bevel) (the cap film, or the device forming film formed in the course of manufacture of the semiconductor device). Such a film causes an increase of the effective annealing temperature, and as a result, the probability of occurrence of a slip dislocation at the outer perimeter of the wafer increases.

A Si substrate having a high bulk micro defect (BMD) density of $1 \times 10^8$ cm$^{-3}$ or more was annealed with a flash lamp under the condition that the power was equal to or higher than 30 J/cm$^2$, and the X-ray topograph was observed. In the observation of the X-ray topograph, slips originating from BMDs were observed. The length of the slips increases as the distance of the slips from the outer perimeter of the wafer decreases.

This result suggests that the stress that occurs becomes greater as the distance from the outer perimeter of the wafer decreases. The reason why dislocations originate from BMDs is that the thermal stress is concentrated at the BMDs, which are discontinuities in the crystal. It can be considered that the heat of the annealing is likely to escape from the outer perimeter of the wafer, and the tensile stress at the outer perimeter of the wafer increases.

In the region around the bevel, the Si substrate has a reduced thickness. In the device region in which the Si substrate is thick, the heat applied to the upper surface of the substrate during the annealing dissipates as the heat is conducted in the depth direction. However, in the region around the bevel in which the substrate has a reduced thickness, the heat is more likely to be accumulated, and the temperature reached rises.

For the reasons described above, in the part of the semiconductor substrates processed according to the comparison examples 1 and 2 in the vicinity of the bevel, the temperature reached rises, and the tensile stress increases. That is, it can be considered that, in the heating process, a slip dislocation or a damage is more likely to occur at the edge of the semiconductor substrate of the semiconductor device, in particular, in the part of the semiconductor substrate in the vicinity of the bevel.

If the slip dislocation or flaw described above occurs at the outer perimeter of the wafer, a local stress is concentrated at the location of the slip dislocation or flaw. Therefore, even if the wafer is not broken in the fast temperature rising/falling annealing step, the wafer can be broken at some point in a subsequent step because of accumulation of the stress in the substrate.

On the other hand, according to the embodiment 1, in the step preceding the fast temperature rising/falling annealing step, the cap film in the vicinity of the bevel and the device forming film 1$b$ formed in the course of manufacture of the semiconductor device are peeled off to expose the silicon of the semiconductor device, thereby raising the reflectance (lowering the emissivity). As a result, the effective annealing temperature for this region can be reduced. For example, it is expected that, if the nitride film is deposited to 50 nm, the emissivity increases to about 84% from about 57%, which is the emissivity when the Si substrate is exposed.

In addition, in the embodiment 1, since the cap film 14 and the device forming film 1$b$ in the vicinity of the bevel are removed, film contraction or expansion during the annealing is suppressed. Therefore, according to the embodiment 1, occurrence of a slip dislocation in the vicinity of the bevel at the edge of the semiconductor substrate of the semiconductor device is suppressed. Therefore, it is considered that sufficient wafer strength against brittle fracture can be assured, and the production yield of the semiconductor device can be improved.

In addition, in the embodiment 1, the cap film remains in the patterned device forming region 1$a$, and therefore, the difference in effective annealing temperature due to a difference in pattern size or coverage ratio (pattern dependency) is eliminated, and high-performance micro MOSFET having high drive power can be stably manufactured.

The region of the upper surface of the semiconductor substrate from which the deposited device forming film 1$b$ is peeled off preferably extends about 1 mm to 3 mm inwardly from the boundary 1$h$ between the upper surface and the bevel surface of the semiconductor substrate. As described above, slips occur concentratedly in a region extending 1 mm to 3 mm from the boundary 1$h$. Therefore, it is essential that at least the film deposited in the region extending 1 mm to 3 mm from the boundary 1$h$ is removed from the semiconductor substrate.

If the process in which the film is removed from the region of the semiconductor substrate that extends 3 mm or more from the boundary 1$h$ is used, the electrical characteristics of the device forming region 1$a$, in particular, the electrical characteristics of an outermost chip can be affected, although the substrate strength is assured. As a result, the electrical characteristics of the wafer in-plane chips of the semiconductor device manufactured in this way disadvantageously vary.

As described above, according to the embodiment 1, the cap film 14 and the device forming film 1$b$ on the lower surface 1$f$ of the semiconductor substrate 1 are also removed. However, the cap film 14 and the device forming film 1$b$ on the lower surface 1$f$ of the semiconductor substrate 1 are not irradiated with light and therefore are not significantly affected by the FLA process. Therefore, these films may not be removed.

As described above, the region extending 1 mm to 3 mm inwardly from the boundary 1$h$ between the upper surface and the bevel surface of the semiconductor substrate is determined as the optimal region on the substrate from which the film is peeled off.

The following are specific examples of the method of removing a multilayer film including a cap film and a device forming film in the vicinity of the bevel as in the embodiment 1.

(Method 1)

Before the fast temperature rising/falling annealing step, the multilayer film including the cap film and the device forming film in the vicinity of the bevel is removed using a bevel grinder dedicated for the pre-FLA step.

(Method 2)

Before the fast temperature rising/falling annealing step, the multilayer film including the cap film and the device forming film in the vicinity of the bevel on the upper surface is etched by using a lower-surface spin etcher to make the chemical permeate also into a part on the side of the upper surface slightly beyond the bevel.

(Method 3)

Before the fast temperature rising/falling annealing step, a resist opening is formed only in the vicinity of the bevel of the edge of the semiconductor substrate in the lithography step, and the multilayer film including the cap film and the device forming film in the vicinity of the bevel is selectively etched away by a dry cleaning technique.

(Method 4)

In the film deposition step before the fast temperature rising/falling annealing step, an edge cut ring is used to prevent the cap film and the device forming film from being deposited in the vicinity of the bevel.

As described above, according to the method of manufacturing a semiconductor device according to this embodiment, the FLA process can be carried out while reducing the possibility of wafer fracture.

Thus, sufficient wafer strength against slip dislocation or brittle fracture due to the super-fast temperature rising/falling annealing can be assured, and therefore, the process window is widened, and the process stability is improved. In addition, a shallow diffusion layer having low resistance can be formed without damage and pattern dependency. Therefore, miniaturization is facilitated, and high-performance MOS transistors having uniform characteristics can be stably manufactured.

In the embodiment described above, a Xe flash lamp is used as the light source, as an example. However, the light source is not limited to the Xe flash lamp, and flash lamps using other kinds of inert gas, mercury, hydrogen or the like, lasers including an excimer laser, a YAG laser, an argon (Ar) gas laser, a nitrogen (N$_2$) gas laser, a carbon monoxide (CO) laser and a carbon dioxide (CO$_2$) laser, or light sources capable of emitting high-intensity light in a range from the near ultraviolet region to the near infrared region, such as a Xe arc-discharge lamp, can also be used.

What is claimed is:

1. A method of manufacturing a semiconductor device including heating a semiconductor substrate, comprising:
   forming a cap film on a surface of the semiconductor substrate;
   selectively removing the cap film at least from an upper surface of an edge of the semiconductor substrate, a bevel surface of the edge of the semiconductor substrate and a side surface of the edge of the semiconductor substrate;
   selectively removing at least a device-forming film formed on the upper surface of the edge of the semiconductor substrate, the bevel surface of the edge of the semiconductor substrate and the side surface of the edge of the semiconductor substrate; and
   heating the semiconductor substrate by irradiating the semiconductor substrate with light having a pulse width of 0.1 milliseconds to 100 milliseconds from a light source after removing the cap film and the device-forming film,
   wherein the cap film has a lower reflectance at a peak wavelength of the light than the semiconductor substrate.

2. The method of manufacturing a semiconductor device according to claim 1, wherein the light source is a flash lamp or a laser.

3. The method of manufacturing a semiconductor device according to claim 1, wherein the cap film is selectively removed so that the cap film covers at least a device region of the semiconductor substrate in which a device is to be formed.

4. The method of manufacturing a semiconductor device according to claim 2, where the cap film is selectively removed so that the cap film covers at least a device region of the semiconductor substrate in which a device is to be formed.

5. The method of manufacturing a semiconductor device according to claim 1, wherein the device-forming film on the upper surface of the edge is removed from a region extending 3 mm from a boundary between the upper surface and the bevel surface of the edge of the semiconductor substrate.

6. The method of manufacturing a semiconductor device according to claim 2, wherein the device-forming film on the upper surface of the edge is removed from a region extending 3 mm from a boundary between the upper surface and the bevel surface of the edge of the semiconductor substrate.

7. The method of manufacturing a semiconductor device according to claim 3, wherein the device-forminq film on the upper surface of the edge is removed from a region extending 3 mm from a boundary between the upper surface and the bevel surface of the edge of the semiconductor substrate.

8. The method of manufacturing a semiconductor device according to claim 4, wherein the device-forming film on the upper surface of the edge is removed from a region extending 3 mm from a boundary between the upper surface and the bevel surface of the edge of the semiconductor substrate.

9. A method of manufacturing a semiconductor device, comprising:
   forming a gate insulating film on a semiconductor substrate;
   forming a gate electrode on the gate insulating film;
   implanting an impurity ion into the semiconductor substrate using the gate electrode as a mask;
   forming a cap film on a surface of the gate electrode and a surface of the semiconductor substrate;
   selectively removing the cap film at least from an upper surface of an edge of the semiconductor substrate, a bevel surface of the edge of the semiconductor substrate and a side surface of the edge of the semiconductor substrate;
   selectively removing at least a device-forming film formed on the upper surface of the edge of the semiconductor substrate, the bevel surface of the edge of the semiconductor substrate and the side surface of the edge of the semiconductor substrate; and
   heating the semiconductor substrate by irradiating the semiconductor substrate with light having a pulse width of 0.1 milliseconds to 100 milliseconds from a light source after removing the cap filming and the device-forming film,
   wherein the cap film has a lower reflectance at a peak wavelength of the light than the semiconductor substrate.

10. The method of manufacturing a semiconductor device according to claim 9, wherein the light source is a flash lamp or a laser.

11. The method of manufacturing a semiconductor device according to claim 9, wherein the cap film is selectively removed so that the cap film covers at least a device region of the semiconductor substrate in which a device is to be formed.

12. The method of manufacturing a semiconductor device according to claim 10, wherein the cap film is selectively removed so that the cap film covers at least a device region of the semiconductor substrate in which a device is to be formed.

13. The method of manufacturing a semiconductor device according to claim 9, wherein the device-forming film on the upper surface of the edge is removed from a region extending 3 mm from a boundary between the upper surface and the bevel surface of the edge of the semiconductor substrate.

14. The method of manufacturing a semiconductor device according to claim 10, wherein the device-forming film on the upper surface of the edge is removed from a region extending 3 mm from a boundary between the upper surface and the bevel surface of the edge of the semiconductor substrate.

15. The method of manufacturing a semiconductor device according to claim 11, wherein the device-forming film on the upper surface of the edge is removed from a region extending 3 mm from a boundary between the upper surface and the bevel surface of the edge of the semiconductor substrate.

16. The method of manufacturing a semiconductor device according to claim 12, wherein the device-forming film on the upper surface of the edge is removed from a region extending 3 mm from a boundary between the upper surface and the bevel surface of the edge of the semiconductor substrate.

* * * * *